(12) United States Patent
Kakoschke et al.

(10) Patent No.: US 7,687,842 B2
(45) Date of Patent: Mar. 30, 2010

(54) BIT LINE STRUCTURE AND METHOD FOR THE PRODUCTION THEREOF

(75) Inventors: Ronald Kakoschke, München (DE); Franz Schuler, Dresden (DE); Georg Tempel, Dresden (DE)

(73) Assignee: Infineon Technologies AG, Munich (DE)

(*) Notice: Subject to any disclaimer, the term of this patent is extended or adjusted under 35 U.S.C. 154(b) by 286 days.

(21) Appl. No.: 11/273,595

(22) Filed: Nov. 14, 2005

(65) Prior Publication Data

US 2006/0108692 A1 May 25, 2006

Related U.S. Application Data

(63) Continuation of application No. PCT/EP2004/050581, filed on Apr. 21, 2004.

(30) Foreign Application Priority Data

May 14, 2003 (DE) ................................ 103 21 739

(51) Int. Cl.
H01L 27/108 (2006.01)
(52) U.S. Cl. ................ 257/300; 257/296; 257/301; 257/E27.084
(58) Field of Classification Search ................ 257/301, 257/532, 296, 300, 302, 303, 304, E27.084, 257/E21.646; 438/386, 387, 388
See application file for complete search history.

(56) References Cited

U.S. PATENT DOCUMENTS

| | | | |
|---|---|---|---|
| 5,555,520 A * | 9/1996 | Sudo et al. .................. 365/149 |
| 5,677,219 A * | 10/1997 | Mazure et al. ............... 438/243 |
| 6,008,522 A | 12/1999 | Hong et al. |
| 6,048,767 A | 4/2000 | Terada |
| 6,137,134 A | 10/2000 | Nakagawa |
| 6,204,527 B1 * | 3/2001 | Sudo et al. .................. 257/301 |
| 6,236,077 B1 | 5/2001 | Gambino et al. |
| 6,255,683 B1 * | 7/2001 | Radens et al. ............... 257/301 |
| 6,438,030 B1 | 8/2002 | Hu et al. |
| 6,458,642 B1 | 10/2002 | Yeh et al. |

(Continued)

FOREIGN PATENT DOCUMENTS

DE    100 62 245 A1    7/2002

(Continued)

OTHER PUBLICATIONS

International Search Report from corresponding International application No. PCT/EP2004/050581.

(Continued)

*Primary Examiner*—Lex Malsawma
*Assistant Examiner*—Robert Huber
(74) *Attorney, Agent, or Firm*—Brinks Hofer Gilson & Lione

(57) ABSTRACT

A bit line structure and associated fabrication method are provided for a semiconductor element or circuit arrangement. The bit line structure contains a surface bit line and a buried bit line. The buried bit line is formed in an upper section of a trench and is connected to an associated first doping region via a first connection layer. A first trench filling layer, which is insulated from the buried bit line by a second trench insulating layer, is situated in a lower section of the trench.

2 Claims, 13 Drawing Sheets

U.S. PATENT DOCUMENTS

| | | |
|---|---|---|
| 6,518,126 B2 | 2/2003 | Wu et al. |
| 6,787,843 B2 | 9/2004 | Templ |
| 2002/0085434 A1* | 7/2002 | Mandelman et al. ........ 365/200 |
| 2003/0008457 A1 | 1/2003 | Makimoto |
| 2004/0227174 A1 | 11/2004 | Richter et al. |

FOREIGN PATENT DOCUMENTS

| | | |
|---|---|---|
| DE | 101 28 211 C1 | 11/2002 |
| DE | 102 40 436 C1 | 12/2003 |
| JP | 02-062061 | 3/1990 |
| WO | WO 01/16960 A1 | 3/2001 |
| WO | WO 01/99152 A2 | 12/2001 |

OTHER PUBLICATIONS

International Examination Report from corresponding International application No. PCT/EP2004/050581.

English Translation of Japanese Examination Report from corresponding Japanese patent application 2006-508297.

* cited by examiner

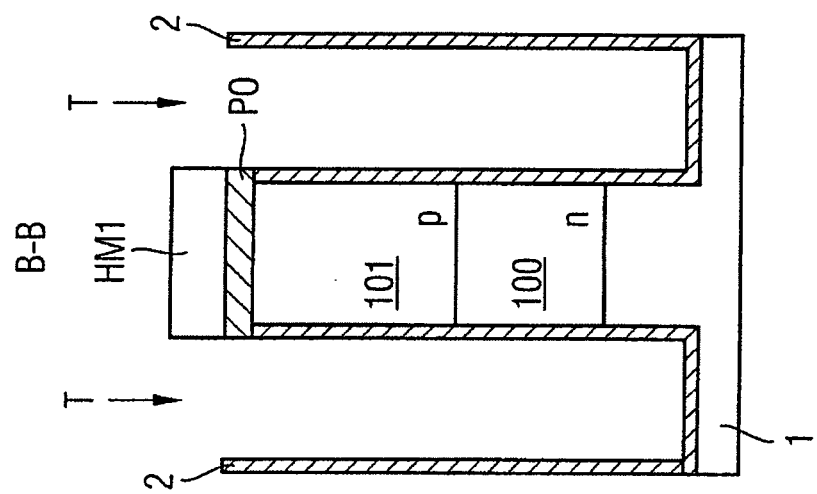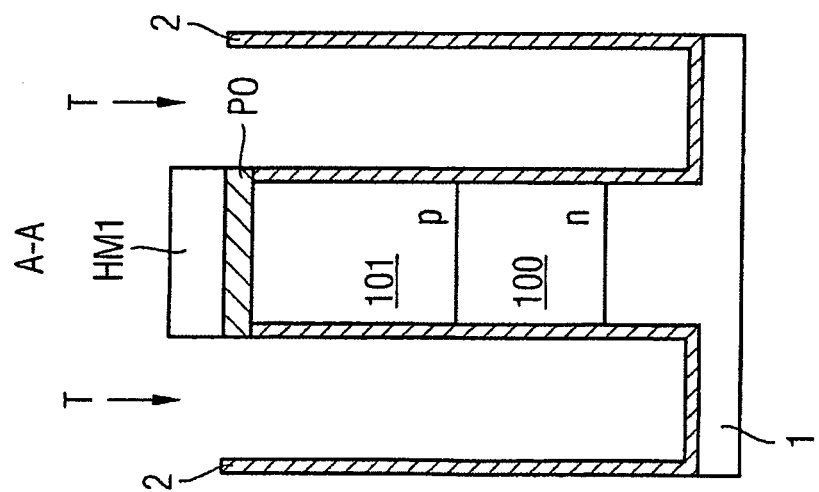

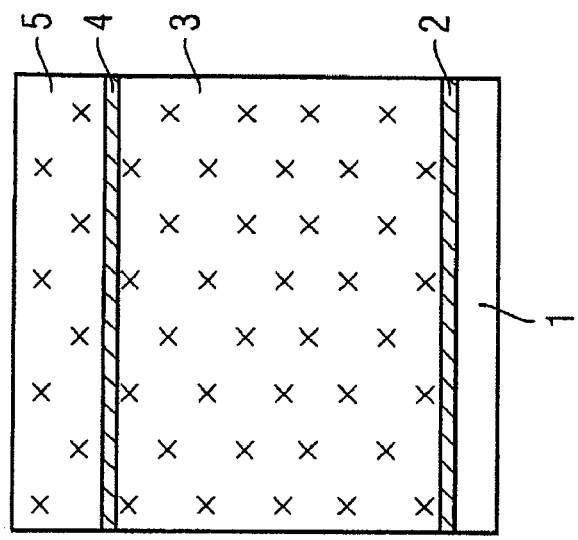
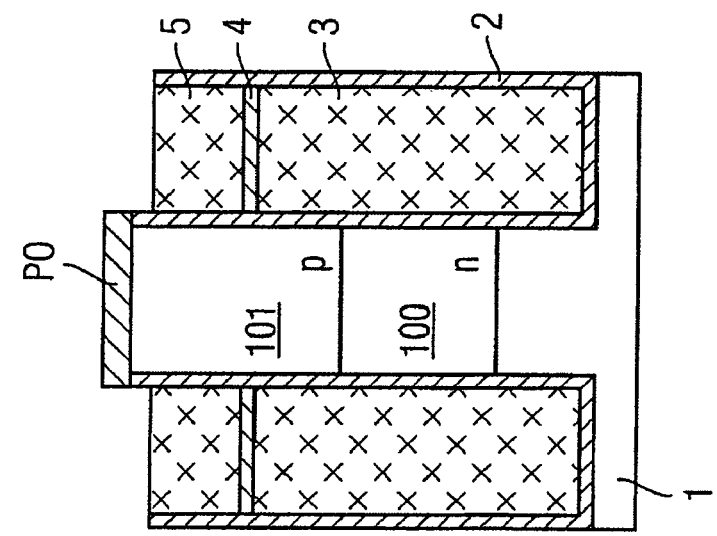
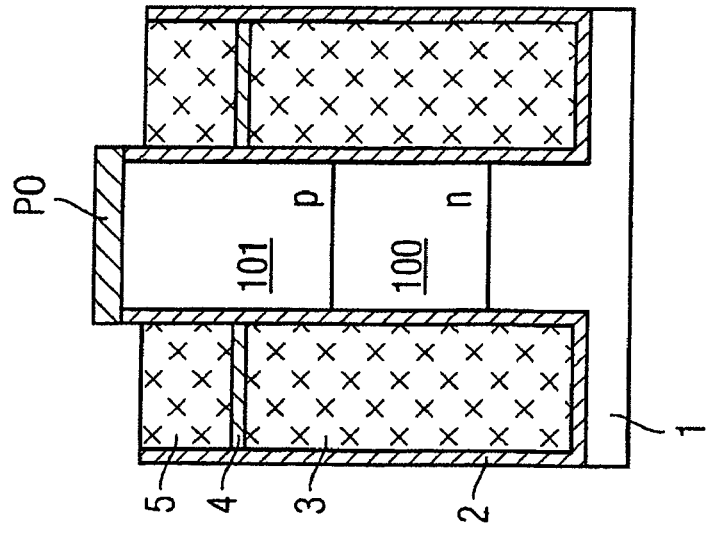

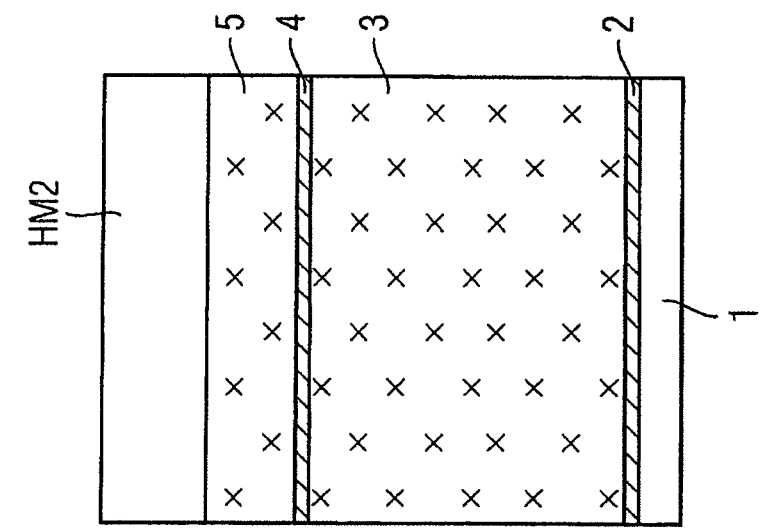
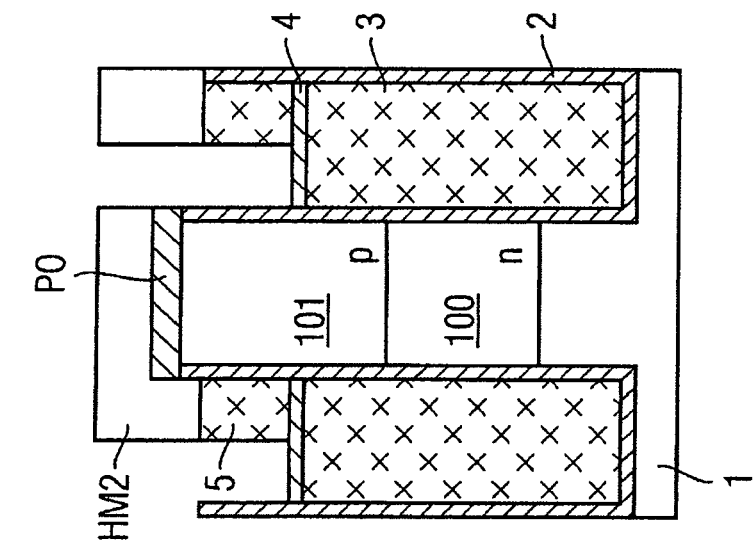
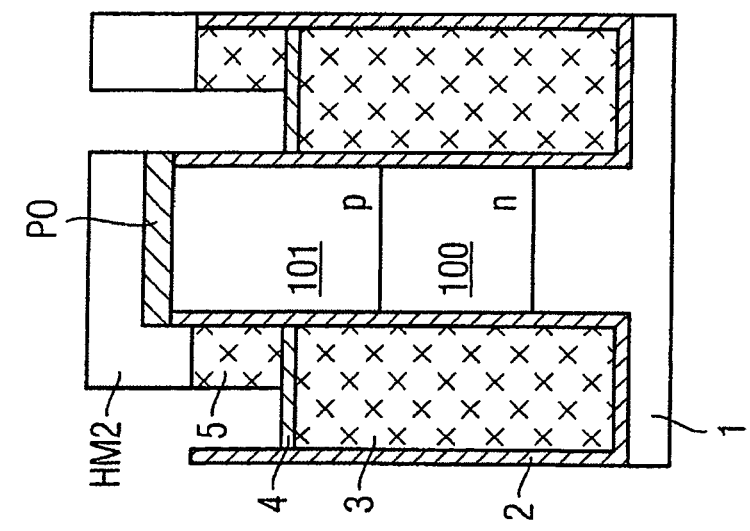

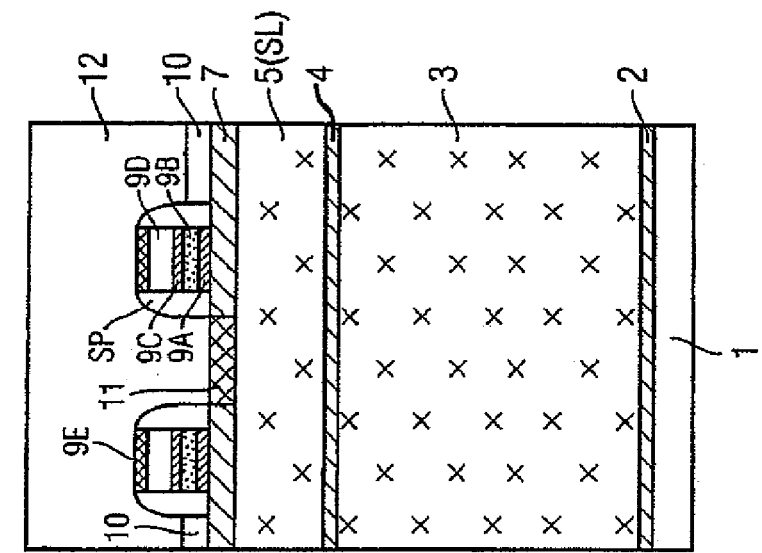
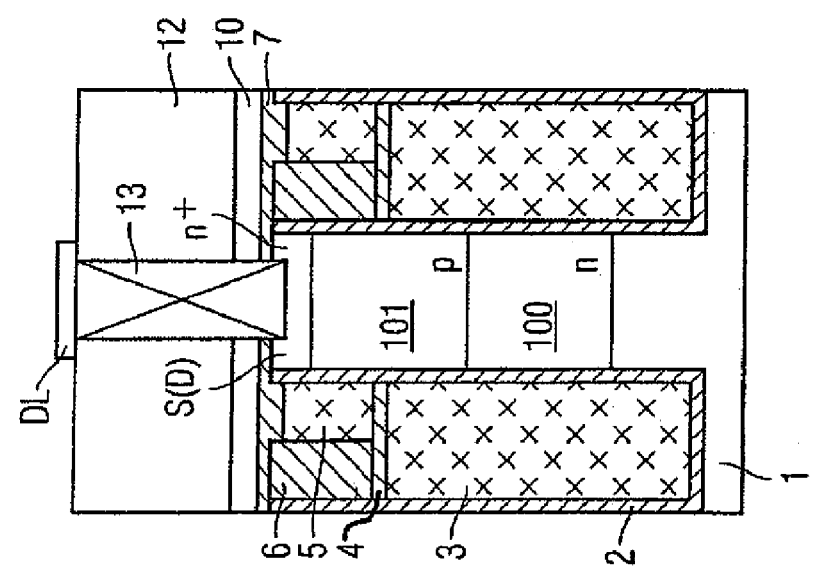
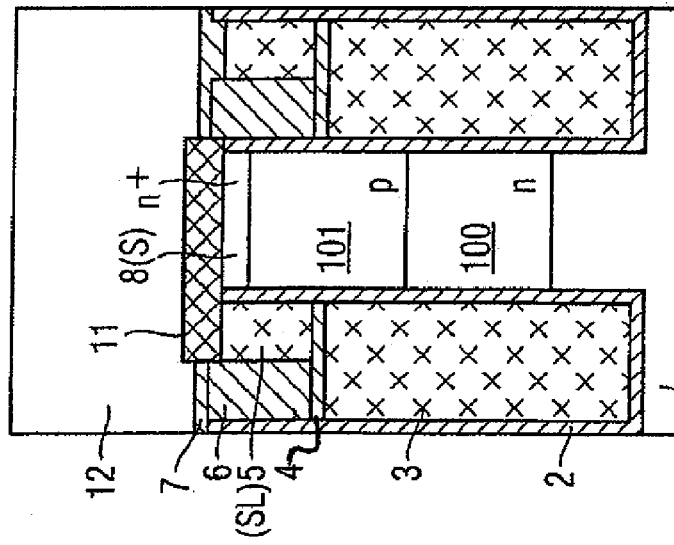

BIT LINE STRUCTURE AND METHOD FOR THE PRODUCTION THEREOF

PRIORITY CLAIM

This application is a continuation of international application PCT/EP2004/050581, filed on Apr. 21, 2004, which claims the benefit of priority to German Application DE 10321739.8 filed on May 14, 2003, both of which are incorporated by reference in their entirety.

TECHNICAL FIELD

The present embodiments relate to a bit line structure and to a method for the production thereof, and in particular to a sub-100 nm bit line structure and an associated production method, as can be used in a non-volatile SNOR memory circuit for selective driving of source and drain lines.

BACKGROUND

In the realization of memory circuits, a distinction is made in principle in terms of the memory architecture, the so-called NAND and NOR architectures being represented most commonly. In both architectures, semiconductor components such as one-transistor memory cells are arranged in matrix-type fashion and driven via word and bit lines.

While in NAND architectures a multiplicity of semiconductor components or memory elements are connected to one another serially and are driven via a common selection gate or a selection transistor, the respective semiconductor components in NOR architectures are organized in parallel or in matrix-type fashion, as a result of which each semiconductor component can be selected individually.

FIG. 1A shows a simplified illustration of a so-called SNOR architecture (Selective NOR), in which, in contrast to the NOR architecture with a "common source" construction, the individual memory elements SE1, SE2, . . . are selectively driven via a respective source line SL1, SL2, . . . and via a respective drain line DL1, DL2, . . . . This selective driving is carried out by respective bit line controllers BLC, which realize the common bit lines BL1, BL2. In this way, it is possible to carry out further shrinkage or more extensive integration of semiconductor circuit arrangements, since the SNOR architecture together with the "uniform channel programming" (UCP) does not rely on a predetermined minimum cell transistor length or channel length.

FIG. 1B shows a simplified illustration of a conventional layout of the SNOR architecture in accordance with FIG. 1A. In accordance with FIG. 1B, the switching elements or memory elements SE1, SE2, . . . are formed in active areas AA of a semiconductor substrate which have a substantially straight strip-type structure. The multiplicity of strip-type active areas AA arranged in columns have superposed on them, in rows, layer stacks or word line stacks WL1, WL2, . . . that are likewise formed in strip-type fashion. Each crossover point or overlap area between such a strip-type active area AA and a word line stack WL formed in strip-type fashion thus constitutes a multiplicity of switching elements or memory elements SE.

Contacts are used for making contact with respective drain regions D and source regions S. The contacts are usually formed in the active areas AA, but they may often also reach into an adjoining isolation region STI (Shallow Trench Isolation). In a further overlying layer, which represents a first metallization layer, there are then situated the source lines SL1, SL2, . . . and also the drain lines DL1, DL2, . . . for the respective bit lines BL. In this case, the drain lines are connected to the associated drain regions D of the active area AA via corresponding contacts KD, the source lines SL being connected to the associated source regions S via corresponding contacts KS in the same way.

Such a conventional bit line structure, on account of the additional source lines, uses metallization that is more than twice as dense compared with a "common source" architecture, which represents a limiting factor for more extensive integration.

In order to improve the integration density, it has been proposed in accordance with German Patent DE 100 62 245 A1 to form the source and drain lines sublithographically as spacers at an insulating fin and to enable contact to be made with the associated source and drain regions by an additional insulating layer with corresponding openings. However, the space requirement, on account of the source and drain lines that are formed at the substrate surface and lie parallel, is still relatively high and prevents more extensive integration.

FIGS. 2A and 2B show a simplified equivalent circuit diagram and also a simplified sectional view of a further conventional bit line structure, as is known for example from U.S. Pat. No. 6,438,030 B1.

In accordance with FIGS. 2A and 2B, the drain line DL1, DL2, . . . is again formed as a surface bit line at a surface of a substrate 100, in which are formed mutually insulated p-type wells 101, 102, . . . for the realization of a buried source line SL1, SL3, . . . in the semiconductor substrate.

For contact-connecting the respective source regions S or 1114, 1112 to the source line SL or the p-type wells 101, 102, . . . , a buried strap BS is formed as a p-type doping region 1113 in the source regions S or 1114 and 1112. The buried strap is connected to the p-type well 101 or the source line. Via a silicide layer 1116, each source region of the switching elements or memory elements SE is electrically connected to the buried strap BS or 1113 and thus to the p-type well 101 or the buried source line. On the other hand, the drain regions D or the doping regions 1111 and 1115 in accordance with FIG. 2B are electrically connected to the surface bit line DL1 via contacts 1118. Furthermore, each p-type well or buried source line 101 is electrically connected via a p-type diffusion region 1010 and an associated contact to a source line SL1 routed at the surface.

The integration density can be considerably improved in this way, since at least a large part of the source line is formed as a p-type well region in a manner "buried" in the semiconductor substrate and correspondingly relaxes the requirements made of the metallization above the substrate surface.

However, the silicide connection layers 1116, on account of the spacers (not-illustrated) at the word line stacks of the memory elements SE, have only a small overlap and consequently cause a high contact resistance with respect to the p-type well 101 or with respect to the source line. In the same way, the conductivity of the p-type well 101 or of the buried source line also represents a limiting factor since either a conductivity is correspondingly low given a low doping of the p-type well 101 or the breakdown voltages of the semiconductor component are correspondingly impaired given a high doping of the p-type well 101.

Furthermore, U.S. Pat. No. 6,008,522 discloses a buried bit line formed in a trench, respective source and drain regions being formed at its upper edges in a self-aligning manner by outdiffusion.

BRIEF DESCRIPTION OF THE DRAWINGS

The present invention is illustrated by way of example and not limited to the accompanying figures in which like references indicate similar elements.

FIGS. 6A to 10C show simplified sectional views of a semiconductor circuit arrangement for illustrating essential method steps in the production of a bit line structure in accordance with a third exemplary embodiment.

Skilled artisans appreciate that elements in the figures are illustrated for simplicity and clarity and have not necessarily been drawn to scale.

DETAILED DESCRIPTION

A bit line structure is obtained which, even in a sub-100 nm range, yields improved integration densities and enables improved insulation properties of adjacent cells or switching or memory elements. The line resistances of the buried bit line are reduced, as a result of which semiconductor arrangements having improved speeds or reduced supply voltages can be realized. Since no additional lithography planes are required, the bit line structure can be realized using standard methods. Moreover, the elements are formed in a self-aligned manner. As a result, the alignment accuracy requirements may be reduced.

Figure 1B:
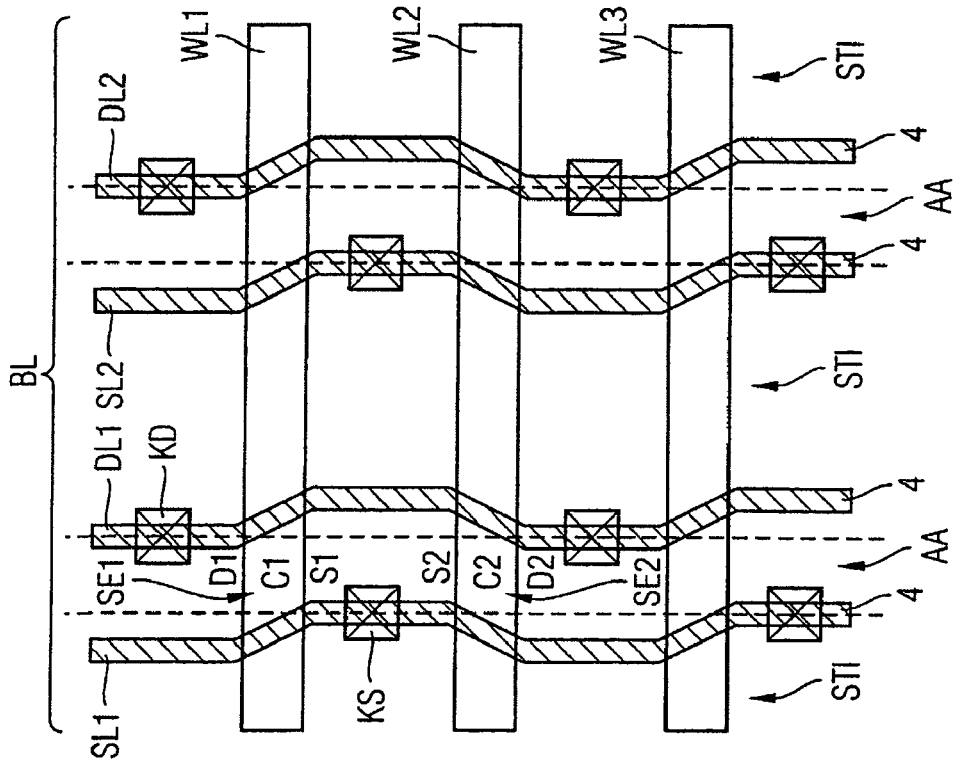
FIGS. 1A and 1B show a simplified equivalent circuit diagram and a simplified plan view of a layout of a conventional bit line structure in an SNOR memory circuit.
Figure 1A:
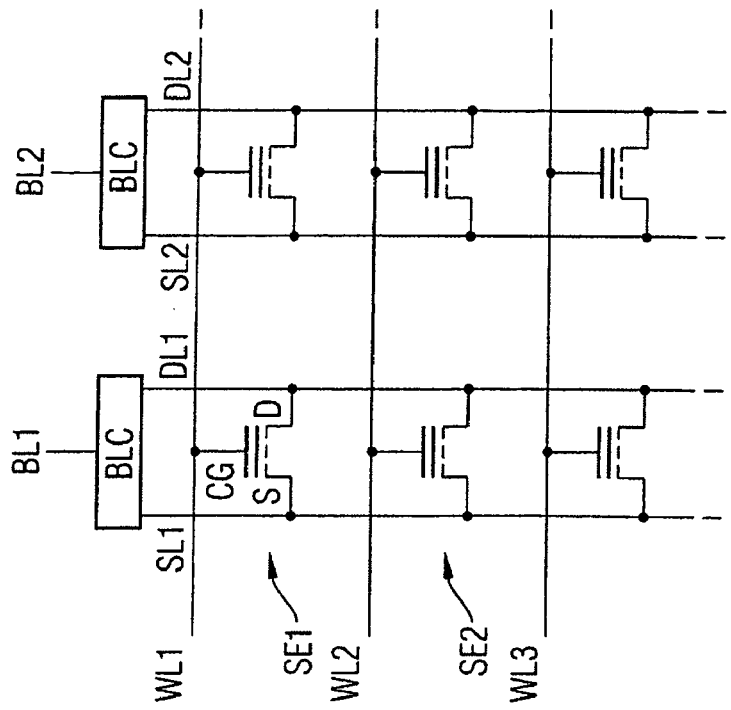
Figure 2A:
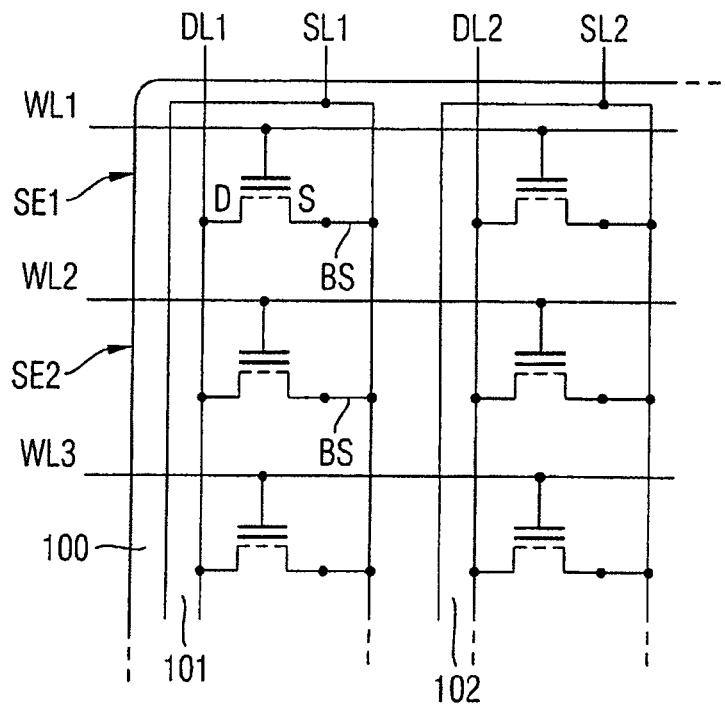
FIGS. 2A and 2B show a simplified equivalent circuit diagram and an associated sectional view of a further conventional bit line structure.
Figure 2B:
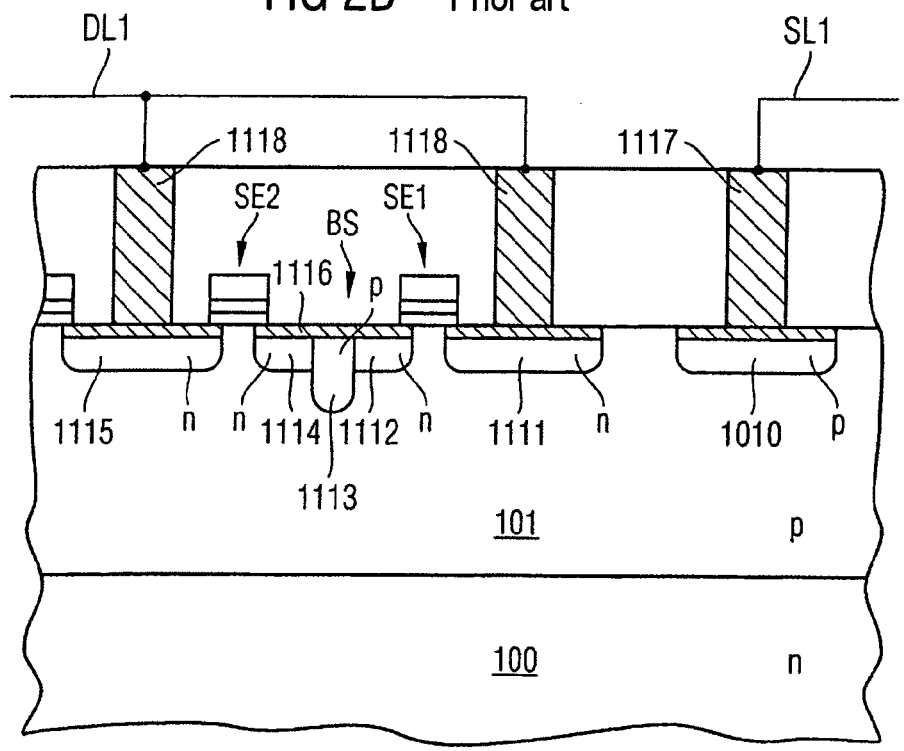
Figure 3:
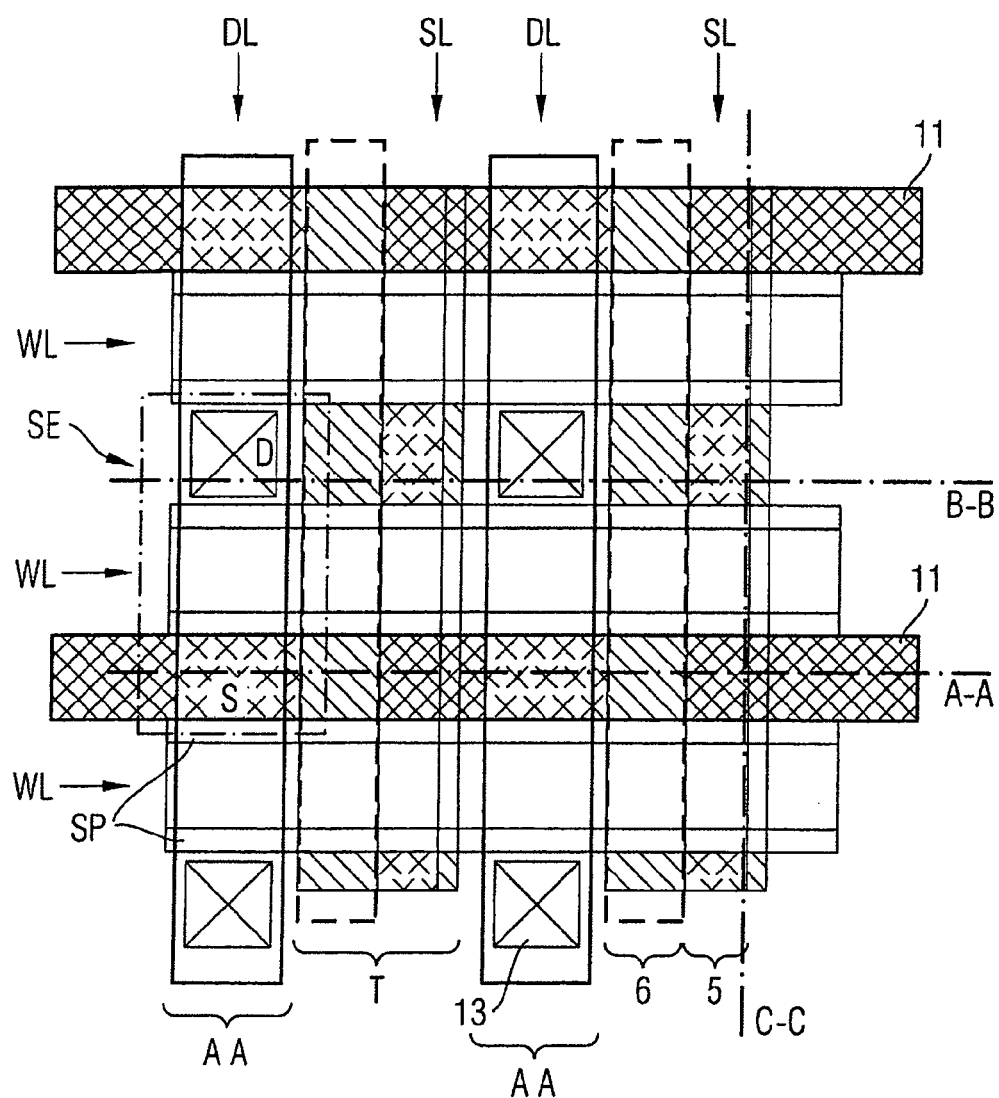
FIG. 3 shows a simplified plan view of a layout of a semiconductor circuit with a bit line structure according to the invention.

FIG. 3 shows a simplified plan view for illustrating a layout of a bit line structure such as may be used in an SNOR semiconductor memory circuit, by way of example.

FIG. 3 shows a substrate, which has, for example, a semiconductor substrate such as crystalline silicon. Strip-type active areas AA are formed in column-type fashion in the substrate by strip-type trench isolations T. Word line stacks WL are formed in row-type fashion perpendicular to the strip-type active areas AA at the surface of the substrate. The word line stacks, in order to realize non-volatile memory elements SE, for example, have a first insulating layer or a tunnel layer, a charge-storing layer, a second insulating layer, and a control layer as the actual driving word line. The first insulating layer may be e.g. a gate oxide layer. The charge-storing layer may be e.g. a floating gate. The second insulating layer may be e.g. an ONO layer sequence. Sidewall insulating layers or spacers SP are formed at the sidewalls of the word line stacks WL for insulation. Accordingly, a switching element or a non-volatile memory element SE is formed at each crossover point or overlap point between the active areas AA and the word line stacks WL. The elements have drain regions D and source regions S as first and second doping regions at the sides of the word line stacks to realize a field effect transistor structure.

In order to realize an area-optimized semiconductor circuit with improved electrical properties, however, the bit line structure comprising a source line and drain line pair SL and DL is not formed exclusively in a metallization plane at the surface of the substrate. Rather, the bit line structure is formed as buried bit line or source line SL in the trench T within the substrate and as surface bit line or drain line DL in a first metallization plane above the substrate surface.

More precisely, the buried bit line SL is embedded in an upper section of the trench isolation or of the trench T. The buried bit line SL is connected to the source regions S that are to be contact-connected. First connection layers 11 are formed locally and provide contact to the source regions S. On the other hand, the surface bit line or drain line DL formed for example in a first metallization plane is connected to associated drain regions D of the switching elements SE via contacts 13. In this way, a bit line structure is obtained which is optimized with regard to area and in which not only are the pitch dimensions (structure width+structure spacing) significantly reduced but moreover the dielectric properties and, in particular, the insulation properties are significantly improved.

In accordance with FIG. 3, the surface bit line DL is formed in strip-type fashion above the active areas AA. This rectilinear strip design permits the surface bit line DL to be lithographically defined in a relatively simple manner, which is useful for sub-100 nm structures, for example. However, surface bit line DL may also have a different form.

FIG. 4 shows a simplified sectional view along a section A-A in accordance with FIG. 3, identical reference symbols again designating identical elements or layers and a repeated description being dispensed with below. For simplification, the layers formed more extensively at the substrate surface for the intermediate dielectric and also for the drain line have not been illustrated.

In accordance with FIG. 4, a semiconductor substrate has a multilayer construction or a multiple well construction. A first p-type well 101 near the surface and a second, deep, n-type well 100 are formed. Such a multiple well construction provides shielding and insulation, since, in these regions of the substrate, sufficient insulating layers can be formed by space charge zones, for example, and complex structures can furthermore be realized.

The trenches T are then formed in the semiconductor substrate or in the associated layers or wells 100 and 101. The trenches at least project beyond the first well 101 and have a trench insulating layer 2 at their trench walls. In a lower section of the trenches T, a first trench filling layer 3 is then formed at the surface of the trench insulating layer 2 such that it completely fills the lower section of the trench. Highly doped polycrystalline semiconductor material may be used. Alternatively, other electrically conductive materials such as e.g. metals or electrically nonconductive materials such as e.g. undoped semiconductor material or insulating material ($SiO_2$) may be used as the first trench filling layer 3. Semiconductor materials, for example, can be deposited in a simple manner and without the formation of undesirable gaps or voids in the deep trenches. The first trench filling layer 3 improves insulation or shielding between the adjacent cells and prevents parasitic transistors from arising along the trench in the direction of the substrate or parasitic transistors from arising along the trench from one cell array to the adjacent cell array. Punch-through or latch-up effects are thereby also reliably prevented in the same way.

In order to realize a highly insulating first trench filling layer 3, a second trench insulating layer 4 is formed at the surface thereof. The level or relative height of the second trench insulating layer 4 lies between the substrate surface and the underside of the first well 101. The insulation properties can thereby be improved further in the multiple well construction illustrated.

Figure 4A:
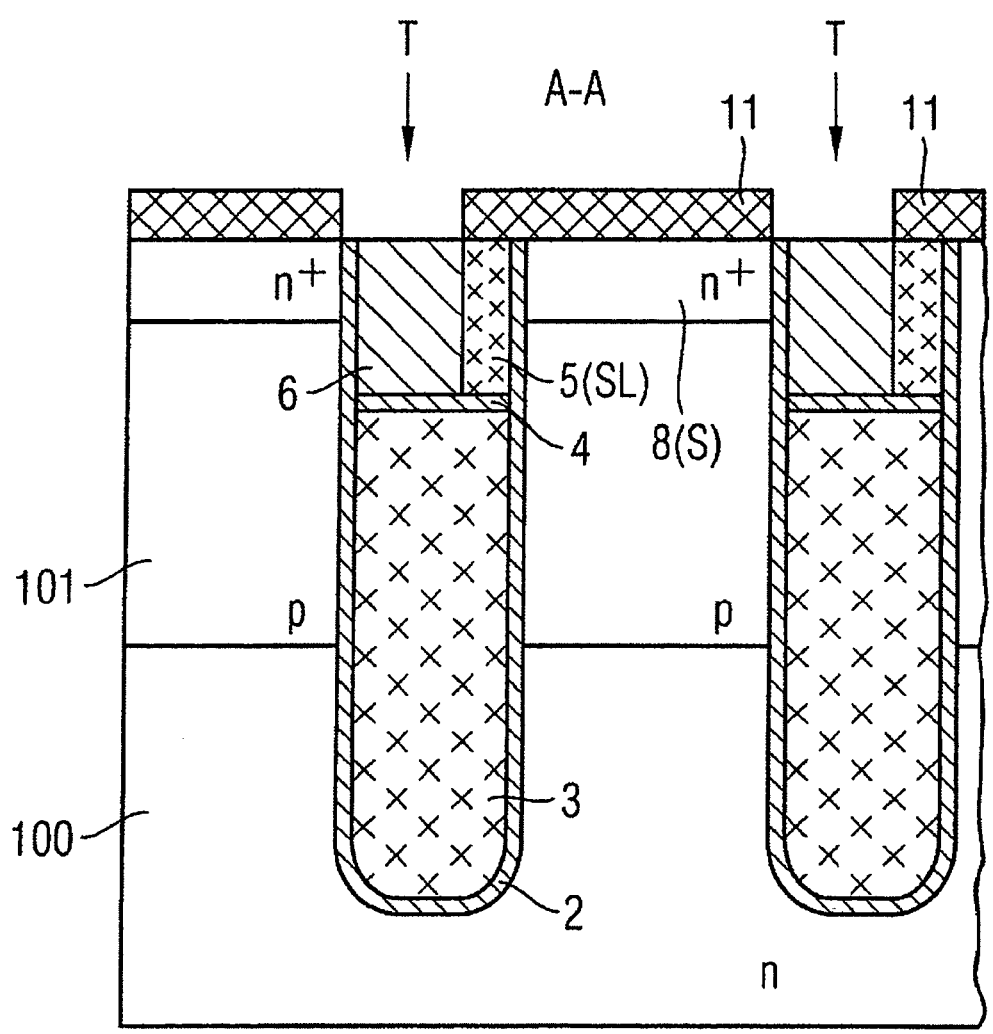
FIGS. 4A to 4C show simplified sectional views of the semiconductor circuit arrangement in accordance with FIG. 3 for illustrating a bit line structure in accordance with a first exemplary embodiment.
Figure 4B:
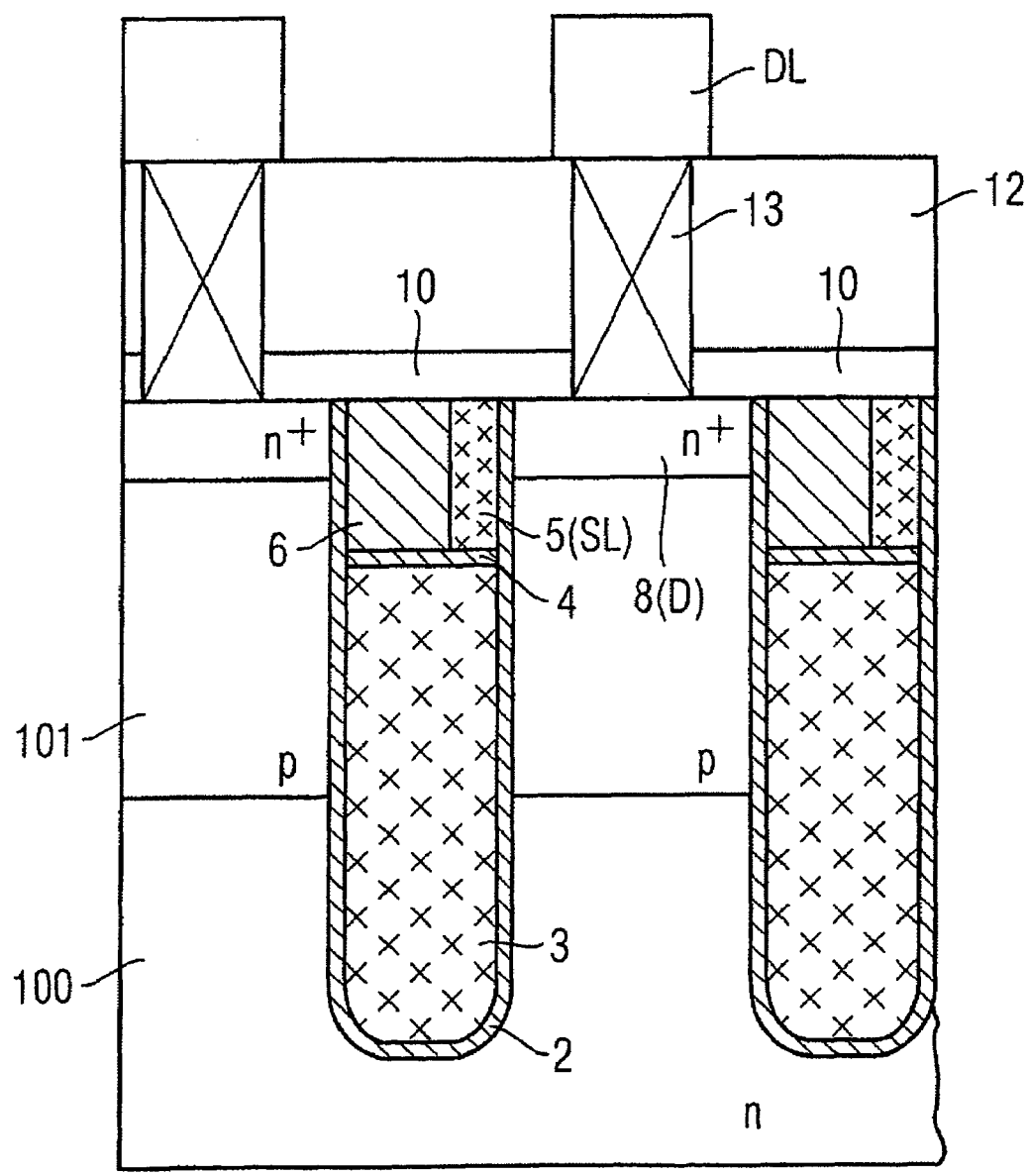
Figure 4C:
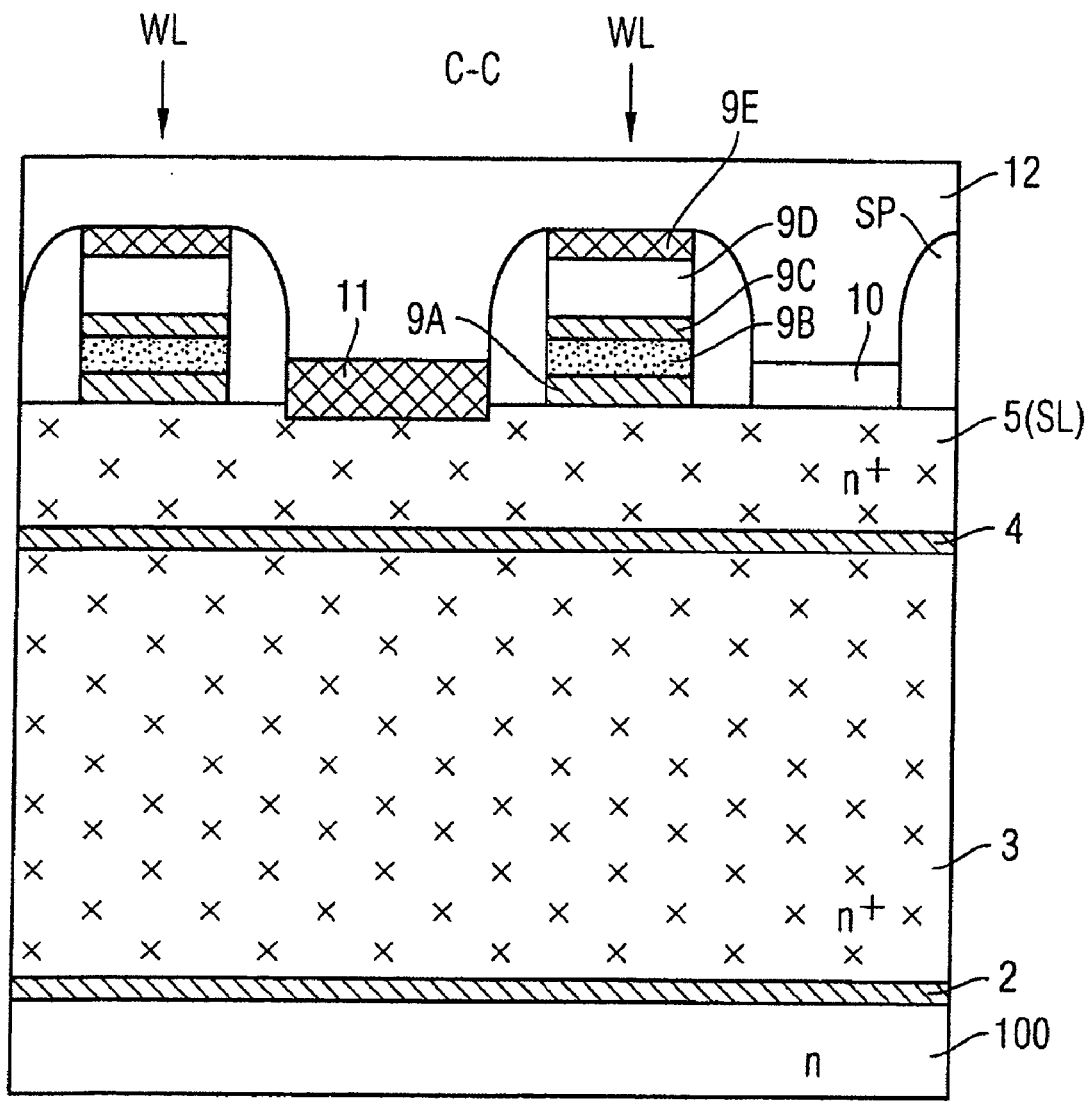

In accordance with FIGS. 4A to 4C, a second electrically conductive trench filling layer for forming an actual buried bit line SL is formed at the surface of the second trench insulating layer 4 such that an upper section of the trench T is filled at least partly up to the substrate surface. Once again, the second trench filling layer 5 used may be highly doped polycrystalline semiconductor material or other electrically conductive materials such as metals in the upper section.

In accordance with FIGS. 4A and 4B, the second trench filling layer 5 is only formed in half of the upper section of the trench T, while the other half of the trench is filled with a third trench insulating layer 6. The third trench insulating layer 6 may be composed of HDP-SiO$_2$ (High Density Plasma) by an STI method (Shallow Trench Isolation). The partial filling of the upper section of the trench T with electrically conductive second trench filling material further improves the insulation properties in this region.

In accordance with FIG. 4C, word line stacks WL are formed at the substrate surface. The word line stacks, in the case of non-volatile memory elements, have a first insulating layer or tunnel layer 9A, a charge-storing layer 9B, a second insulating layer or ONO layer sequence 9C and a control layer 9D and are correspondingly patterned. In order to realize first and second doping regions 8 for the drain regions D and the source regions S of the first conduction type (n$^+$), spacers SP may be formed at the sidewalls of the word line stacks WL in a known manner.

In accordance with the first embodiment, a silicide blocking layer 10 is then formed. The silicide blocking layer 10 permits self-aligned first electrically conductive connection layers 11 to be formed. The first electrically conductive connection layers 11 electrically connect the first doping regions S to the second trench filling layer 5 at the surface of the second doping regions D. The silicide blocking layer 10 prevents the uncovered semiconductor material from being silicided. After the whole-area formation of silicideable material, accordingly a conversion of the silicideable material into a silicide is carried out only at the uncovered locations of the semiconductor material. As a result, the first electrically conductive connection layers 11 are obtained in a self-aligned manner for the first doping regions S. In particular, if a trench filling layer 5 is composed of polysilicon, the first doping regions S can thus be connected in a self-aligned manner via the first connection layer 11 to the second trench filling layer 5 or the buried bit line with outstanding connection contacts. If the control layer 9D is also composed of a polycrystalline semiconductor material, it is accordingly also possible for a highly conductive control layer 9E to be formed at its surface, thereby improving the conductivity in the word line stack.

In this case, the first and second doping regions S and D are once again formed in a self-aligned manner by ion implantation.

A surface dielectric 12 is subsequently formed at the substrate surface or at the surface of the word line stacks, the silicide blocking layer 10 and also the first connection layer 11. A surface bit line or a drain line DL is then formed at the surface of the surface dielectric. In order to connect the surface bit line DL to the second doping regions D, a second connection layer 13 is formed in the surface dielectric. The second connection layer 13 may be a conventional contact.

Figure 5:
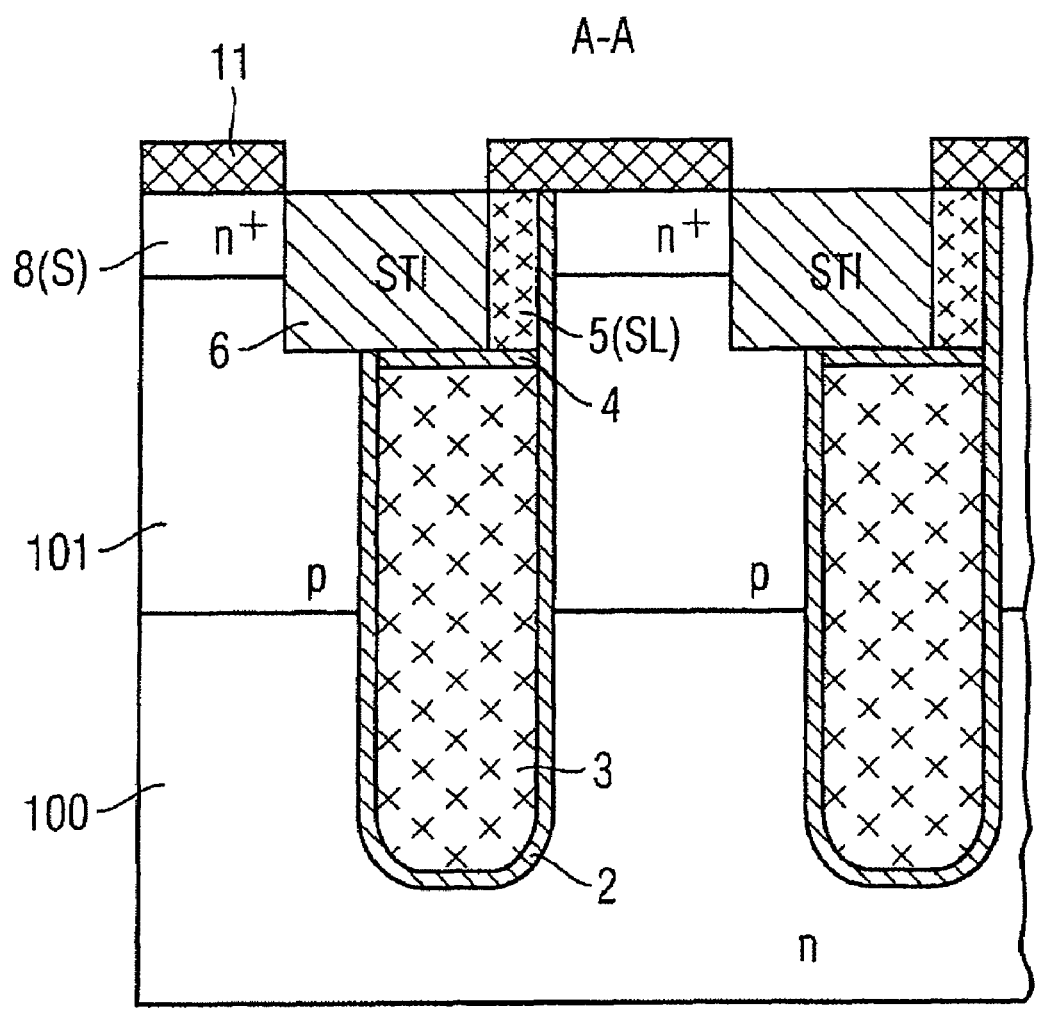
FIG. 5 shows a simplified sectional view of a semiconductor circuit arrangement for illustrating a bit line structure in accordance with a second exemplary embodiment.

FIG. 5 shows a simplified sectional view of a semiconductor circuit arrangement for illustrating a bit line structure in accordance with a second embodiment, identical reference symbols designating layers or elements identical or corresponding to those in FIGS. 1 to 4 and a repeated description being dispensed with below.

In accordance with FIG. 5, in place of the third trench insulating layer 6 formed in a self-aligned manner in accordance with FIG. 4A, it is also possible to form a non-self-aligned third trench insulating layer 6. The non-self-aligned third trench insulating layer may be formed by a shallow trench isolation (STI) at the substrate surface in the upper section of the deep trench T.

FIGS. 6A to 10C show simplified sectional views along respective sections A-A, B-B and C-C in accordance with FIG. 3 for illustrating a fabrication method of a bit line structure in accordance with a third embodiment, identical reference symbols once again designating elements or layers identical or corresponding to those in FIGS. 1 to 5, and a repeated description being dispensed with below.

In accordance with FIGS. 6A to 6C, a first p-type well 101 and a second n-type well 100 in the semiconductor substrate 1 are formed, for example, by ion implantation. After formation of the first p-type well 101 and second n-type well 100, deep trenches T are formed using a patterned first hard mask layer HM1 and an underlying pad oxide PO. The methods used in DRAM fabrication for the formation of deep trenches may be used. However, unlike the deep trenches used in DRAM fabrication, the trenches here are not locally delimited trenches but rather elongated isolating trenches T.

Afterward, a first trench insulating layer 2, such as a liner oxide, is formed thermally. The first trench insulating layer 2 may be formed at the trench surface of the trenches T. While the first hard mask HM1 has Si$_3$N$_4$, for example, SiO$_2$ may be used for the first trench insulating layer 2 and the pad oxide PO.

In accordance with FIGS. 7A to 7C, a first electrically conductive or nonconductive trench filling layer 3 is subsequently formed at the surface of the trench insulating layer 2 in a lower section of the trench T. In one embodiment, a complete filling of the trench T and a subsequent etching-back step is carried out. The trench T may be filled with, for example, highly doped or undoped polysilicon or some other electrically conductive or nonconductive material.

A second trench insulating layer 4 is subsequently formed at the surface of the first trench filling layer 3. If polysilicon is used for the first trench filling layer 3, an oxide layer may be grown by thermal treatment to form the second trench insulating layer 4. A buried bit line SL is formed from a second electrically conductive trench filling layer 5 at the surface of the second trench insulating layer 4. The second electrically conductive trench filling layer 5 fills an upper section of the trench T at least partly up to the substrate surface. A further deposition process may be carried out to fill the trench. Specifically, polysilicon may be deposited, followed by etching back as far as the substrate surface. The first hard mask layer HM1 composed of Si$_3$N$_4$ is then removed or stripped.

Afterward, in accordance with FIGS. 8A to 8C, an unrequired part of the trench filling layer is removed from the upper trench section using a second hard mask layer HM2, for example by a standard STI method. The second hard mask layer HM2 may also contain Si$_3$N$_4$ and may at least partly cover the trench filling layer 5 provided for the buried bit line. Alternatively, it is possible to form an oxide layer (not illustrated) in the uncovered regions, thus resulting in another liner oxide in the uncovered shallow trench.

Figure 9A:
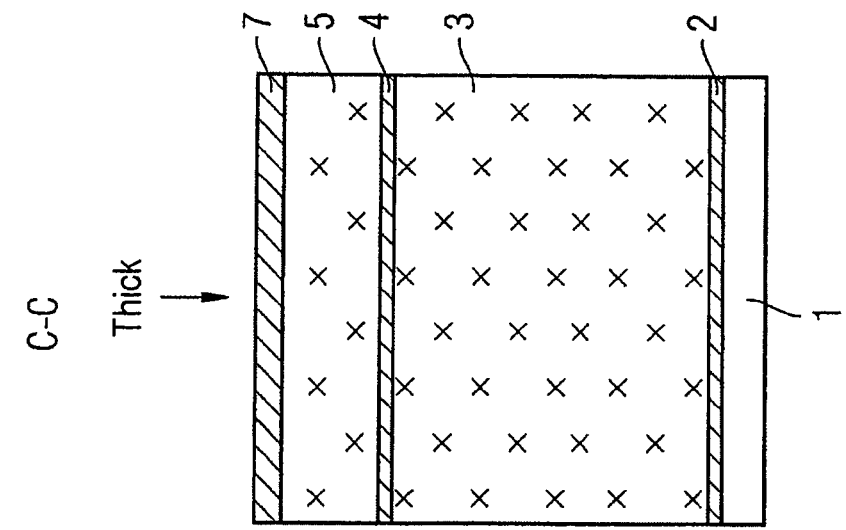
Figure 9B:
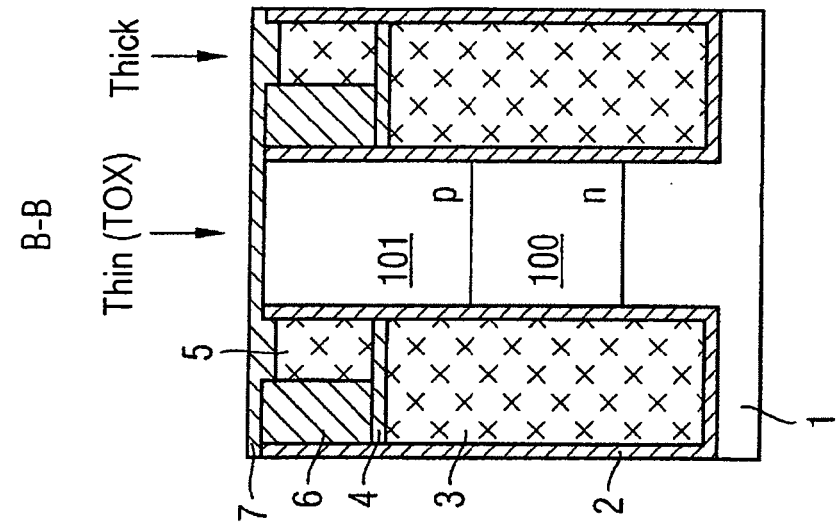
Figure 9C:
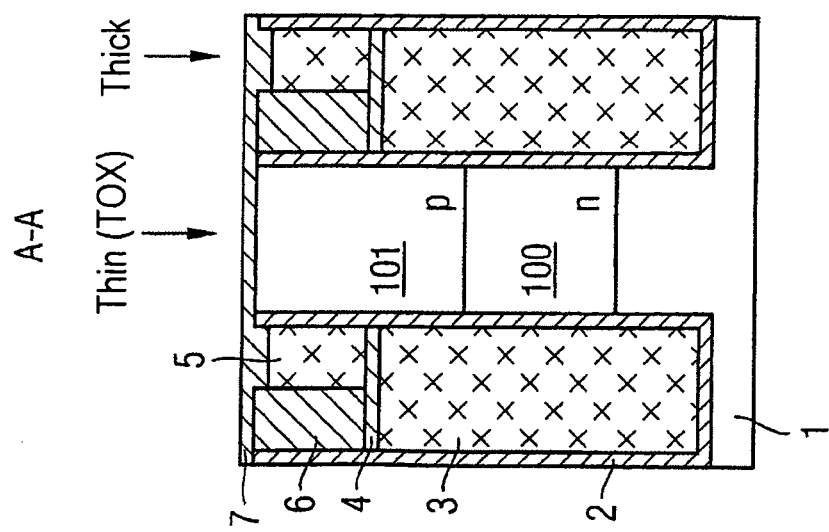

In accordance with FIGS. 9A to 9C, the second hard mask layer HM2 is then subjected to a pull-back etching, as a result of which this layer is partly etched back and the edges are rounded. This is followed by an HDP method (High Density Plasma), by deposition of a third trench insulating layer 6 as a shallow trench isolation layer (STI), for example. As a result, the uncovered upper section of the trench T is now filled again. To remove the residual pad oxide layer PO and also the residual second hard mask layer HM2, chemical mechanical polishing (CMP) with subsequent HF dipping may be used.

In addition, in a section of the semiconductor substrate that is not illustrated, a high-voltage dielectric may be deposited and a first part of this high-voltage dielectric may be removed on the relevant cell area illustrated in the figures. Afterward, in accordance with FIGS. 9A to 9C, a first surface insulating layer 7 may be grown thermally, in which case a second part of the high-voltage dielectric is formed in the high-voltage area and, in the present relevant cell area, at the surface of the active areas AA, a very thin gate dielectric or a tunnel insulating layer (TOX) may be formed, which simultaneously has a significantly higher thickness in the region of the highly doped trench filling layer 5 (on account of the higher growth rates) and thus reliably prevents active field effect transistor structures from arising. In this way, a very thin tunnel oxide layer that is usually used above the active areas AA is obtained by just one method step, while a reliable passivation using a significantly thicker layer thickness is achieved above the highly doped polysilicon trench filling layer 5.

Finally, in accordance with FIGS. 10A to 10C, the word line stacks WL are formed by conventional methods. The word line stacks WL contain, as shown, an optional first insulating layer 9A, a charge-storing layer 9B, a second insulating layer or ONO layer sequence 9C and a control layer 9D. The word line stacks WL are provided with spacers or sidewall insulation layers SP.

A silicide blocking layer 10 is subsequently formed in the region of the second doping regions D. A silicide blocking layer is usually deposited over the whole area and then patterned lithographically. The silicide blocking layer 10 may comprise an $Si_3N_4$ layer.

Prior to the formation of the silicide blocking layer 10, the doping regions 8 are usually formed as highly doped first or source region S and second or drain region D. The doping regions 8 are formed by ion implantation in a self-aligned manner using the word line stacks WL or the associated spacers SP in the surface of the substrate.

In order to form the first electrically conductive connection layer 11 for electrically connecting the first doping regions or source regions S to the second trench filling layer 5 or the buried bit line SL, by way of example, silicideable material or a silicideable metal layer such as e.g. cobalt, nickel or platinum is deposited over the whole area. This is followed by a conversion of the surface layer of the semiconductor material using the silicideable material for the formation of highly conductive first connection regions 11 and also highly conductive control layers 9E of the word line stacks WL. No silicide is formed at the surfaces that are not in contact with the semiconductor material (silicon), that is to say at the regions covered by the silicide blocking layer 10 and other layers. Rather, the deposited material (metal) remains, permitting the deposited but not silicided metal layer to be etched back selectively by a wet-chemical etching method. In this way a single mask or mask layer can be used to carry out the self-aligned formation both of the first connection layers 11 and of the highly conductive control layer 9E.

Afterward, a surface dielectric 12 is formed as an intermediate dielectric at the substrate surface and a second electrically conductive connection layer 13 in the form of a conventional contact is produced therein. The contact or the connection layer 13 may comprise a contact hole or via to the second doping region D, in which a TiN layer is formed as a barrier layer with a W layer as a filling layer. Finally, at the surface of the surface dielectric 12, i.e. in the first metallization plane, an electrically conductive layer is deposited over the whole area and patterned to produce a surface bit line or drain line DL, which make contact with the second doping regions or drain regions D via the contacts 13.

A bit line structure with outstanding electrical properties is obtained in this way. As the buried bit line 5 has a very high conductivity and is optimally connected to its associated doping regions S via the first connection layer 11, the lower section of the trench that is filled with the first trench filling layer 3 enables outstanding insulation or outstanding shielding between cell regions and reliably prevents parasitic effects in the semiconductor substrate.

Figure 11C:
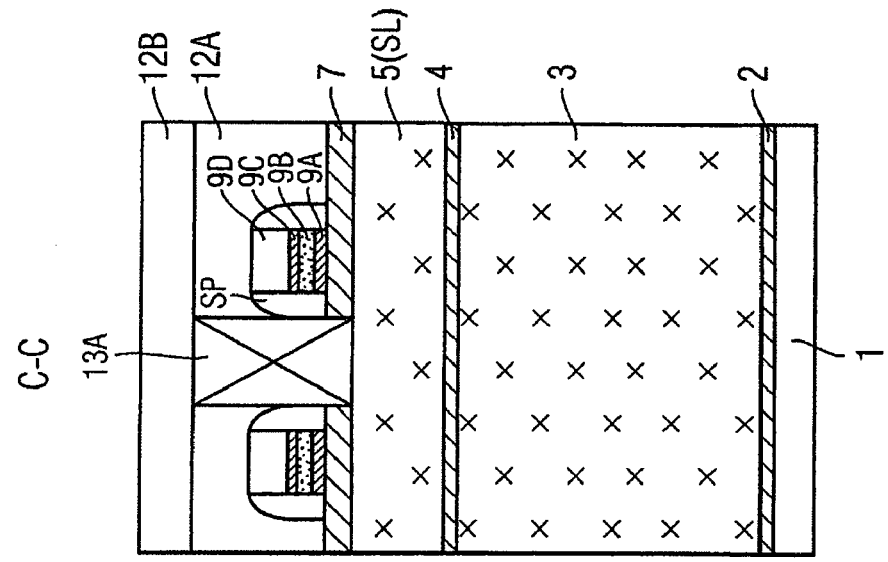
FIGS. 11A to 11C show simplified sectional views of a semiconductor circuit arrangement for illustrating a bit line structure in accordance with a fourth exemplary embodiment.
Figure 11B:
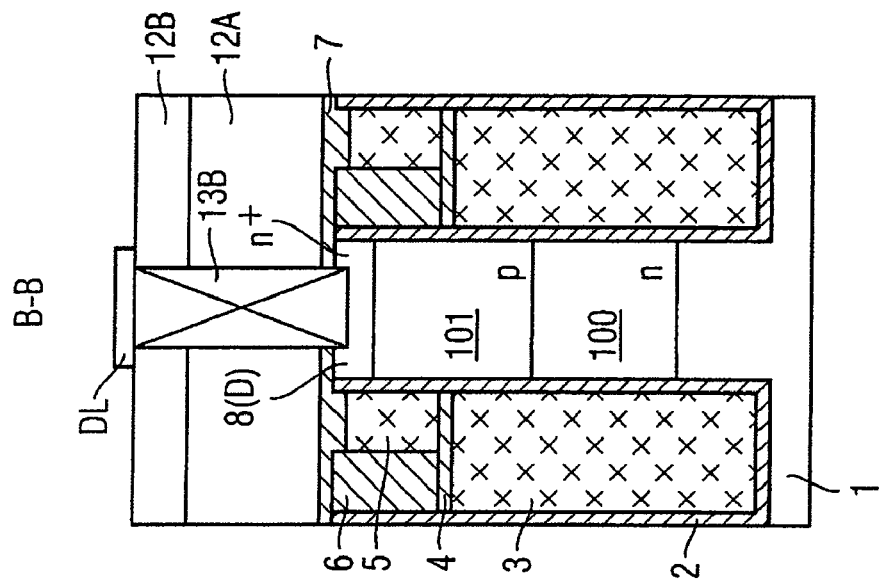
Figure 11A:
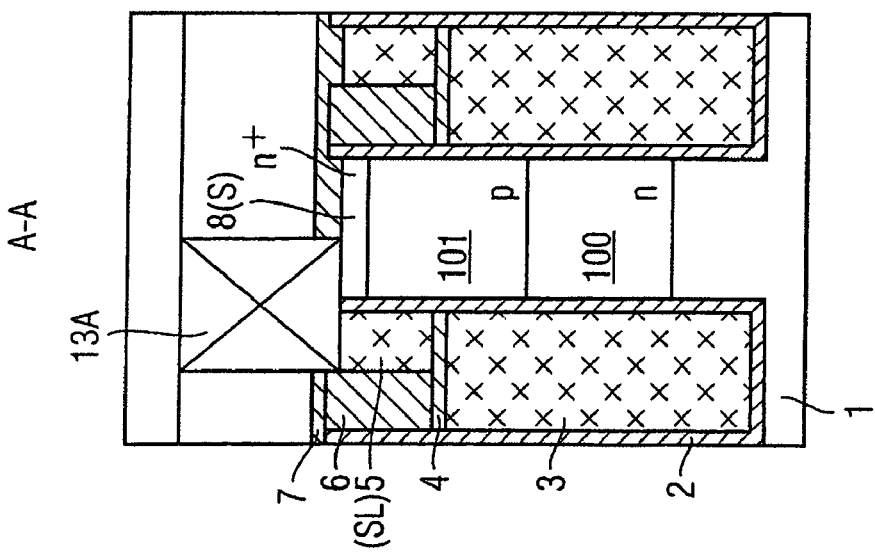

FIGS. 11A to 11C show simplified sectional views of the semiconductor circuit arrangement for illustrating a bit line structure in accordance with a fourth embodiment, identical reference symbols designating elements or layers identical or corresponding to those in FIGS. 1 to 10 and a repeated description being dispensed with below.

In accordance with FIGS. 11A to 11C, it is possible, as an alternative to the above-described silicide layer as a highly conductive first connection layer 11, also to use a dummy contact as first connection layer 13A. If, in a standard method, no silicide blocking layer 10 is available and the use of silicideable material is available, then the first connection layer may also be realized by a dummy contact 13A.

For this purpose, the surface dielectric merely has a first dielectric layer 12A and a second dielectric layer 12B formed thereon. The dummy contact 13A is formed by conventional methods for the production of contacts only in the first dielectric layer 12A at the locations in the semiconductor substrate or the circuit at which the second trench filling layer 5 is intended to be electrically connected to the first doping regions S. It is once again possible in this case, after lithographically forming a contact hole in the first dielectric layer 12A, to fill in a TiN barrier layer and also a W filling layer and then to form a second dielectric layer 12B there above to avoid short circuits. Insulating layers 7 that may be present are removed in this case, as a result of which a highly conductive contact-connection is once again obtained using standard methods. In this case, the second connection layer 13B is again formed by conventional contact methods by forming a contact hole or via both in the first and in the second dielectric layer 12A and 12B at the locations of the second doping regions D to be contact-connected and is filled with electrically conductive material in a known manner.

In summary, a semiconductor component or a memory arrangement contains a trench. The use of an electrically nonconductive material such as undoped polysilicon or $SiO_2$ for a first trench filling layer in the trench improves insulation properties in conjunction with simple producibility. The use of an electrically conductive material such as e.g. highly doped polysilicon or a metal for the first trench filling layer, makes it possible to improve the shielding properties of the trenches in conjunction with outstanding insulation properties.

The insulating properties are further improved using second and third trench filling layers. The second trench filling layer is formed in an upper section of the trench at the side with respect to the first doping region to be connected, while the other side of the trench is filled with a third trench insulating layer and with a shallow trench isolation (STI).

If crystalline silicon is used for the substrate, highly doped polysilicon is used for the second trench filling layer, and a silicide layer is used for the first connection layer, a silicide blocking layer may be formed at least above the second doping regions. As a result, the buried bit line can be connected to the associated doping regions in a self-aligned manner and with minimal contact resistance. As an alternative, it is also possible to use a dummy contact in place of the silicide layer. In this case, first and second dielectric layers are formed for the surface dielectric and the dummy contact is formed only in the first dielectric layer. In the standard process, no silicide blocking layers are deposited and no siliciding is carried out, thereby obtaining a highly effective alternative contact-connection of the doping regions to the buried bit line.

If the substrate has a multilayer well construction, the trench projects beyond the bottommost well into the substrate and the second trench insulating layer lies at a level between substrate surface and an underside of a first well. The insulating properties between adjacent cells can be further improved, in which case, parasitic transistors, latch-up effects and also punch-through effects can be reliably prevented and the electrical properties can be improved further.

The invention has been described above on the basis of a non-volatile SNOR semiconductor memory circuit. However, it is not restricted thereto and encompasses in the same way further semiconductor circuits which have a corresponding bit line structure. Furthermore, the invention is not restricted to the described silicon semiconductor substrates and associated materials, but rather encompasses in the same way alternative semiconductor materials with corresponding dopings or insulating possibilities. In the same way, it is also possible for the source and drain regions and also the associated source and drain lines to be correspondingly interchanged.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:
1. A bit line structure comprising
   a substrate containing a trench, the trench having a bottom and sidewall portions extending from the bottom along the length of the trench;
   a first trench insulating layer disposed at the bottom of the trench and at least portions of the sidewall of the trench;
   a first trench filling layer disposed at a surface of the first trench insulating layer and fills a majority of the trench and forms a surface that is entirely planar, the entire surface of the first trench filling layer being substantially perpendicular to the length of the trench and bounded by the first trench insulating layer disposed at the sidewall of the trench;
   a second trench insulating layer disposed on the surface of the first trench filling layer, the second trench insulating layer forming a surface that is entirely planar, the second trench insulating layer covers entirely the surface of the first trench filling layer;
   a second electrically conductive trench filling layer forming a buried bit line which is at least partly formed at the surface of the second trench insulating layer and fills an upper section of the trench up to a surface of the substrate;
   first and second doping regions of a first conduction type, which are disposed in the substrate, portions of the first and second doping regions being directly adjacent to the first trench insulating layer;
   a first electrically conductive connection layer that electrically connects the first doping region to the second trench filling layer and is directly adjacent to the first doping region, the first trench insulating layer, and the second trench filling layer;
   a surface dielectric disposed at the surface of the substrate and the filled trench;
   a surface bit line disposed at a surface of the surface dielectric; and
   a second connection layer in the surface dielectric, the second connection layer connecting the surface bit line to the second doping region.
2. The bit line structure of claim 1, wherein the second trench filling layer is disposed in the upper section of the trench at a side most proximate to the first doping region, and the opposing side of the trench is filled with a third trench insulating layer, the third trench insulating layer is at least partly formed at the surface of the second trench insulating layer.

* * * * *